(12) United States Patent
Cooper (10) Patent No.: US 9,343,649 B1
(45) Date of Patent: May 17, 2016

(54) METHOD FOR PRODUCING SMOOTH INNER SURFACES

(71) Applicant: Charles A. Cooper, Warrenville, IL (US)

(72) Inventor: Charles A. Cooper, Warrenville, IL (US)

(73) Assignee: U.S. Department of Energy, Washington, DC (US)

( * ) Notice: Subject to any disclaimer, the term of this patent is extended or adjusted under 35 U.S.C. 154(b) by 0 days.

(21) Appl. No.: 14/678,139

(22) Filed: Apr. 3, 2015

Related U.S. Application Data (63) Continuation-in-part of application No. 13/746,765, filed on Jan. 22, 2013, now abandoned.

(60) Provisional application No. 61/589,536, filed on Jan. 23, 2012.

(51) Int. Cl.
| | |
|---|---|
| *B24B 31/00* | (2006.01) |
| *B24B 31/02* | (2006.01) |
| *H01L 39/24* | (2006.01) |
| *H05H 7/20* | (2006.01) |
| *H01P 11/00* | (2006.01) |

(52) U.S. Cl.
CPC .............. *H01L 39/24* (2013.01); *B24B 31/006* (2013.01); *B24B 31/02* (2013.01); *H01P 11/008* (2013.01)

(58) Field of Classification Search
CPC ...... B24B 31/00; B24B 31/006; B24B 31/02; B24B 31/06; B24B 31/14; B24B 31/003; H01L 39/00; H01L 39/14; H01L 39/24; H05H 7/20

USPC .......... 451/32, 33, 34, 35, 74, 113, 104, 106, 451/326, 328; 205/51
See application file for complete search history.

(56) References Cited

U.S. PATENT DOCUMENTS

| | | | | |
|---|---|---|---|---|
| 3,687,823 | A  * | 8/1972 | Lugscheider et al. | 205/51 |
| 3,939,053 | A  * | 2/1976 | Diepers et al. | 204/212 |
| 4,014,765 | A  * | 3/1977 | Roth et al. | 205/651 |
| 4,115,916 | A  * | 9/1978 | Meyerhoff | 29/599 |
| 8,324,134 | B2 * | 12/2012 | Saito et al. | 505/401 |
| 8,470,155 | B2 * | 6/2013 | Saito et al. | 205/78 |
| 8,517,795 | B2 * | 8/2013 | Saito et al. | 451/5 |
| 2002/0132565 | A1* | 9/2002 | Srinivasan-Rao et al. | 451/54 |
| 2005/0282473 | A1* | 12/2005 | Saito et al. | 451/54 |
| 2011/0130294 | A1* | 6/2011 | Saito et al. | 505/401 |

(Continued)

FOREIGN PATENT DOCUMENTS

| | | | | |
|---|---|---|---|---|
| DE | 10018244 A1 | * | 11/2000 | C25F 3/00 |
| JP | 04131400 A | * | 5/1992 | C25F 3/16 |

(Continued)

*Primary Examiner* — Eileen Morgan
(74) *Attorney, Agent, or Firm* — Jacob A. Heafner; Brian J. Lally; John T. Lucas (57) ABSTRACT

The invention provides a method for preparing superconducting cavities, the method comprising causing polishing media to tumble by centrifugal barrel polishing within the cavities for a time sufficient to attain a surface smoothness of less than 15 nm root mean square roughness over approximately a 1 mm² scan area. The method also provides for a method for preparing superconducting cavities, the method comprising causing polishing media bound to a carrier to tumble within the cavities. The method also provides for a method for preparing superconducting cavities, the method comprising causing polishing media in a slurry to tumble within the cavities.

10 Claims, 8 Drawing Sheets

(56) References Cited

U.S. PATENT DOCUMENTS

2013/0112455 A1* 5/2013 Sennyu ............... 174/50.5
2014/0018244 A1* 1/2014 Taylor et al. ............... 505/300

FOREIGN PATENT DOCUMENTS

| JP | 2003037000 A | * | 2/2003 | ............... H05H 7/20 |
| JP | 2011086450 A | * | 4/2011 | |

* cited by examiner

1 KM ceramic angle cut triangle media

2 12.5 mm RG-22 cones 3 3 – 6 mm cubic hardwood blocks, 400 mesh Alumina 4 3 – 6 mm cubic hardwood blocks, 800 mesh Alumina 5 3 – 6 mm cubic hardwood blocks, 40 nm colloidal silica

FIGURE 6

1 KM ceramic angle cut triangle media 2 12.5 mm RG-22 cones 3 3 – 6 mm cubic hardwood blocks, 400 mesh Alumina 4 3 – 6 mm cubic hardwood blocks, 800 mesh Alumina 5 3 – 6 mm cubic hardwood blocks, 40 nm colloidal silica

METHOD FOR PRODUCING SMOOTH INNER SURFACES

REFERENCE TO RELATED APPLICATIONS

This application claims the benefit of U.S. patent application Ser. No. 13/746,765 filed on Jan. 22, 2013, which claims the benefit of U.S. Provisional Patent Application No. 61/589,536 filed on Jan. 23, 2012.

GOVERNMENT INTERESTS

The United States Government has rights in this invention pursuant to Contract No. DE-AC02-07CH11359 between the U.S. Department of Energy and the Fermi Research Alliance representing Fermi National Accelerator Laboratory, Batavia, Ill.

FIELD OF THE INVENTION

The invention pertains to a method for preparing smooth surfaces, and more particularly, this invention relates to a method for generating smooth inner surfaces for superconductive cavities.

BACKGROUND

In general, all superconducting radio-frequency resonating (SRF) cavities, or simply superconducting cavities, require removal of material from their interior surfaces due to the metallurgical damage introduced by forming and welding, and due to contamination that penetrates those interior surfaces. Important metrics of SRF cavity technology are manufacturing yield, the Quality Factor (Q), and the accelerating electric field (EAcc) which increase with increasing amount of removed material, up to a point where the damaged material is removed and the uncovered pristine metal provides the best superconducting properties. These quantities drive cost and performance factors related to cryogenics, beam energy, and machine length. Quality Factor (Q) is proportional to cavity shape (G) divided by surface resistance ($R_s$), i.e., $$Q \alpha G/R_s$$

whereby G depends on the cavity shape and $R_s$ depends on cavity surface geometry and chemical purity. The invented method aims to improve performance via optimization of $R_s$.

Cavity fabrication and processing emphasizes very smooth surfaces because both Q and EAcc can be improved as the surface roughness is decreased. When operated in the usual mode that aligns the electric field with the cavity's longitudinal axis to accelerate a particle beam, magnetic fields align with the cavity surface and are highest near the cell equator. The high magnetic fields seen near the cell equators can cause flux penetration and a local breakdown in the superconducting state that leads to global quenching of the cavity.

SRF cavities are an enabling technology for efficient particle accelerators. They are central to physics machines that produce high-energy and high intensity beams, and they enable other applications such as next-generation light sources, sub-critical nuclear reactors and spent fuel remediation, medical isotope production, emissions reduction, and screening for defense and security.

Niobium is generally considered the metal of choice for SRF cavities, partly because of its temperature stability, corrosion resistance, and because it is paramagnetic. It has the largest magnetic penetration depth of any element. Also it is an unregulated metal. However, the invented method can be applied to other materials too, and particularly those harder than niobium, including but not limited to vanadium, technetium, titanium, copper, aluminum, steel, and alloys thereof.

After SRF cavities are made there is an 80 to 120 micron damage layer covering the inner surface of the cavities which must be removed. The damage layer is most prevalent at the equatorial weld bead produced during manufacture of the SRF cavity. This material has typically been removed in the past by buffered chemical polishing (BCP). The chemical polishing is done in two steps, the first being a "bulk" removal of 100-150 μm of metal. The "bulk" removal step appears to be less important for the final properties. Good results have been obtained when "light" electropolishing (EP) is the second step. EP is used if higher accelerating gradients are required. EP processes produce a typical average roughness (RA) of approximately 0.1 μm for a 1 mm×1 mm area scan using a profilometer.

EP has several drawbacks. The electrolyte that is typically used, 9 parts by volume 98 percent concentrated sulfuric acid and 1 part 49 percent concentrated hydrofluoric acid, is toxic and requires extensive facilities, training, and operation protocols. Spent acid must be disposed of as a hazardous toxin. Sulfur byproducts can form and deposit on the surface, potentially limiting cavity performance. In addition, the complexity of the EP process can make it difficult to control fluorine ion diffusion into the surface of the cavity. Generally, EP requires follow-on high pressure rinses and hydrogen degassing equipment.

Beyond these drawbacks, a central problem with EP is its tendency to retain topographic profiles for features larger than a few tens of micrometers. This means that detects such as weld pits, which can be several hundred micrometers across and 10-100 μm deep, are not removed by bulk EP, even though the topography becomes relatively more smooth. For cavities that are limited by quench at such defects, repeated EP processing often does not repair this situation.

Another problem with EP is that it cannot remove pits near the equator welds of SRF cavities. These pits may be the result of flaws of material preparation prior to welding, flaws in the welding process itself, flaws in the EP process or a combination of these possibilities.

Centrifugal barrel polishing (CBP) is sometimes used to remove the bulk of unwanted film on the insides of SRF cavities. CBP provides a means for imparting pressure on polishing media against the inner surfaces of a cavity. CBP comprises a main shaft rotating in one direction and barrels in rotatable communication with the hub rigidly attached to the main shaft. This allows CBP to rotate SRF cavities residing in those barrels at a direction opposite of the main shaft at typical rotation rates of 100-150 rpms. CBP can create a more uniform surface, albeit initially a rougher one, by ameliorating or minimizing surface defects caused by welding or as a natural characteristic of the work piece.

After undergoing CBP processes, it was still necessary to undergo chemical polishing as a follow up treatment, as previous standard CBP alone generates surface finishes of no better than about 100 nanometers. This is because the mechanical forces that CBP imparts on cavity surfaces often leads to smearing of layers of the surface and pull-out or avulsion of regions of the cavity surface.

In addition to the foregoing, heat treatment (up to 800° C.) is a typical part of cavity surface preparation processes. This heat treatment can cause an additional 20 micron thick layer of contamination in addition to the original unwanted 80-120 micron layer made during cavity manufacturing.

A need exists in the art for a method for producing smooth surfaces for use in SRF. The method should eliminate the use of high concentrations and quantities of acid, and the heat treatment step of state found in the art fabrication techniques. The method also should utilize simple CBP techniques and require only average technician skills.

These and other objects, aspects, and advantages of the present disclosure will become better understood with reference to the accompanying description and claims.

Briefly, the invention provides a method for preparing SRF cavities without using acid, the method comprising selecting a polishing media, loading the polishing media into a SRF cavity, and rotating the cavity such that the polishing media machines the inner surface of the cavity. The machining process by the polishing media is a slow abrasion type action as the polishing media tumbles within the cavity. This Extended Mechanical Polishing (XMP) method produces a substantially defect free surface, with a profile smoothness of less than 15 nm root mean square roughness over approximately a 1 mm$^2$ scan area. Generally, the invented XMP method removes damage from the inner surface of the cavity associated with welding of the cavities during initial fabrication, and has shown being capable of repairing cavities damaged with pits.

Figure 1:
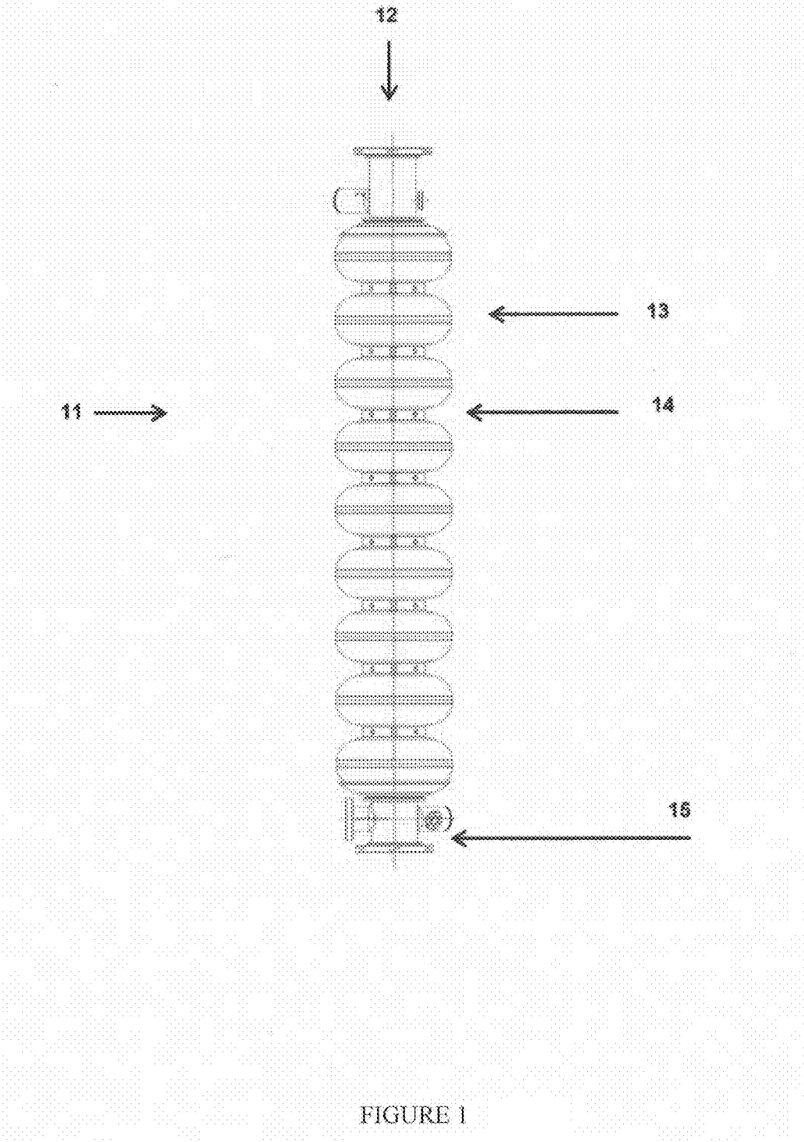
FIG. 1 illustrates an exemplary SRF cavity.

A myriad of cavity shapes are accommodated with the invented method. Generally, the invented process can be performed on elliptical cavities of different frequencies. There are many different elliptical shapes, with three exemplary ones being TESLA, reentrant, and low-loss shapes. For example, suitable cavities include those depicted in FIG. 1. Referring to FIG. 1, a cavity 11 when operated in the usual mode that aligns the electric field with the cavity's longitudinal axis 12 to accelerate a particle beam, magnetic fields align with the surface of a cavity 11 and are highest near the cell equator 13. An iris 14 exists between each radially extending portion of the cavity. For polishing operations, the cavity 11 is fitted with a cap 15 to seal the cavity 11.

A feature of the invention is that the SRF cavity surfaces may be prepared without the use of acid treatments. Where acid treatments are desired, for example in the final stage of polishing, approximately 85 percent less acid is required compared to typical cavity surface preparation methods. An advantage of this invention is the elimination of toxic acid waste streams and buffered chemical polishing.

Still another object of the present invention is providing a method for creating or repairing Tesla type cavities. A feature of the method is that the cavities are polished in an inert atmosphere. Another feature is that only mechanical means are utilized to polish the cavities. An advantage of the method is its heightened safety and lack of need for special handling facilities.

Yet another object of the present invention is to produce SRF cavities with high Q and EAcc at a 90 percent or better yield rate. A feature of the invention is that the XMP process is conducted at temperatures between about 20° C. and 50° C. An advantage of the invention is that no chemistry step is necessary to produce the SRF cavities.

Also provided is a method for smoothing inner surfaces of superconducting cavities, the method comprising performing more than one stage where each stage comprises: selecting a polishing media, loading the polishing media into a resonance cavity of a SRF cavity, rotating the SRF cavity such that the polishing media machines an inner surface of the SRF cavity, and evacuating the SRF.

DETAILED DESCRIPTION

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide a method for preparing smooth surfaces, and more particularly, this invention relates to a method for generating smooth surfaces for superconductive cavities without requiring acid.

The invention combines selecting polishing media for use in combination with centrifugal barrel polishing to machine the inner surfaces of SRF cavities such that the inner surfaces have <15 nm RMS roughness over approximately a 1 mm2 scan area. RMS roughness was measured with a KLA-Tencor P-16 Stylus-Type surface profilometer. This obtained roughness is an order of magnitude less than the typical roughness produced by niobium cavity electro-polishing. This enhanced smoothness leads to a reduction of field emission and also serves as preparation for high-quality films or coatings.

The invented XMP method may be performed in a single stage or multiple stages, varying the polishing media and any supporting materials such as carriers from one stage to the next. Performing XMP in multiple stages allows for one or more bulk material removal stages followed by one or more polishing stages. Necessarily, the SRF cavity must be evacuated of its polishing media after each stage. In a bulk removal stage, material is removed from the inner surface of an SRF cavity at a relatively high rate in order to quickly expose uncontaminated niobium while providing a surface smooth enough to begin polishing. For example, a bulk removal stage quickly removes the built up weld bead from the circumference of a SRF cavity formed during manufacturing or repair.

Aside from SRF cavity surface preparation, the invention is also applicable in producing various medical devices, including but not limited to medical implants. Medical implants in general require as smooth a surface as possible. Niobium is more bio-compatible than titanium and is gaining interest for medical implants. Separately, the invention enables the production of extremely smooth surfaces in trapped volumes such as gun barrels. Generally, the invented process is novel for its use of composite polish media in confined volumes.

The invented method also provides a method for repairing SRF surfaces without generating new defects. Weld pits can be removed and high acceleration restored to affected cells by the invented process. The replacement of bulk EP by the invented method results in higher yield and lower cost in making SRF cavities for particle accelerators.

An embodiment of the invention is that no acid, or relatively little acid is used to produce the surfaces. For example a 120 micron-thick layers of contaminant are moved via chemical processing after electropolishing discussed supra. That amounts to approximately 52 gallons (200 liters) of electrolyte when processing a standard 9-cell cavity where slightly less than 1 kilogram of Niobium is removed. The invented method can be performed such that a smoothness of <15 nm RMS roughness over approximately a 1 mm2 scan areais accomplished, obviating the requirement to use any chemical step to finalize the inner surface preparation. However, even should a practitioner desire to perform a final chemical treatment step to remove for example, the final 20 microns of the inner surface of the SRF after a bulk of material is removed with XMP, then less than 9 gallons of chemical is required for the respective SRF cavity.

In selecting a polishing media, selection is based on a utilizing a polishing media having the characteristics such as the requisite size, shape, mass, and composition necessary to apply force to remove material at a desired removal rate via machining the inner surface of the SRF. Polishing media may be a single particle or a plurality of particles. In addition to desirable machining of the inner surface, smear and pull-out of material is a function of polishing media particle size, shape and force of media against the cavity surface and is avoided.

Many media geometries are suitable, including but not limited to spheres, cones, cylinders, square and triangular pyramids, rectangular and triangular prisms, stars and more complex geometries. Many compositions of polishing media are contemplated. Polishing media may be homogenous metal particles such as solid spheres, ceramics, ceramic composites comprised of ceramic and a binder, or natural products such as wood. The binder used for the ceramics are a wide range of different plastics. Further, the polishing media may be of a homogenous density such as a stainless steel ball bearing, or porous such as a clay pellet. In general, a polishing media of increased mass creates more force against the inner surface of the SRF, leading to reduced polishing times. Further the polishing media may be composite polishing media composed of multiple different materials.

As the polishing media machines the inner surface of the SRF cavity, the polishing media removes high spots in the surface preferentially. The polishing media impacts the surface, drags across the surface and leaves the surface with a small piece of the niobium surface bound to it. With this polishing process, when properly controlled, there is no imbedded polishing media left behind As noted supra, smear and pull-out is a function of particle size, shape and force of media against the cavity surface. The instant method avoids these adverse effects by increasing the tumbling time for the final polishing stage, detailed infra. Also, choosing particle shapes that favor machining over laminating at particle sizes below 15 microns minimizes smear. In the polishing stages of XMP, typical particle sizes range from about 0.01 microns to 40 microns. Finally, colloidal particle sizes are typically used in a final polishing stage and range from about 0.01 microns to 0.08 microns in size. Throughout the disclosure, the representative diameter of the polishing media will typically refer to an average particle size in the particle size distribution of a polydisperse plurality of particles, and may include discrete size ranges within the plurality.

Several different types of media are suitable. These media include, but are not limited to the following:
- 9 mm by 9 mm KM ceramic angle cut triangle media (a solid ceramic), purchased from Kramer Industries, Inc. of Piscataway, N.J.
- 12.5 mm RG-22 cones (a composite of ceramic and binder) from Mass Finishing, Inc. of Howard Lake, Minn.;
- 3-6 mm cubic hardwood blocks (Raytech Metal 3-6 mm cubic hardwood blocks (Raytech Metal Finishing, Middletown, Conn.);
- 400-800 mesh alumina powder; and
- 40 nm colloidal silica (Allied High Tech Products Inc., Compton, Calif.).

A salient feature of the invention is the use of a carrier which serves as a support for polishing media in order to enhance their performance. A carrier is a material bound to the polishing media. A carrier is bound to a polishing media when it is in contact or communication with the polishing media. A single carrier may be bound to a single polishing media particle where the carrier acts as a shell for example, or support a plurality of polishing media particles where the carrier acts more as an envelope. Polishing media may be homogenously dispersed throughout the shell carrier. However, the active polishing agent may also reside proximal to the surface or the carrier, and alternatively entirely on the surface of the carrier.

The use of carriers with different density and aspect ratios changes the force on the cavity surface, further decreases the potential for smearing or pull out. In an embodiment of the invention, carriers may comprise multiple zones such that in addition to the polishing media, additives such as carrier fluid and surfactants may enter the carrier. The carriers may also be of solid construction. Accordingly, the carriers may be comprised of wool, wood, open or closed cell foams, rubbers, metals, natural fibers, synthetic fibers, or other such natural and synthetic material Further, the carriers may be comprised of multiple materials designed to release the polishing media in a controlled manner and apply the appropriate amount of force to the surface.

Wool is a preferred carrier for the final polishing step as it should not damage even the smoothest surfaces with nanometer scale average roughness. Balls made from wool, similar to common cotton balls, may be soaked in a mixture of a polishing media and a liquid, such that the polishing media enters into the wool. Hence, the wool carrier holds the active polishing agent. Another preferred carrier is a hardwood block, which was found to be superior to many other fibrous organic and inorganic media. Similar to wool, a plurality of wooden blocks are soaked in a mixture of the polishing media such that the block carriers hold the polishing media.

Figure 2:
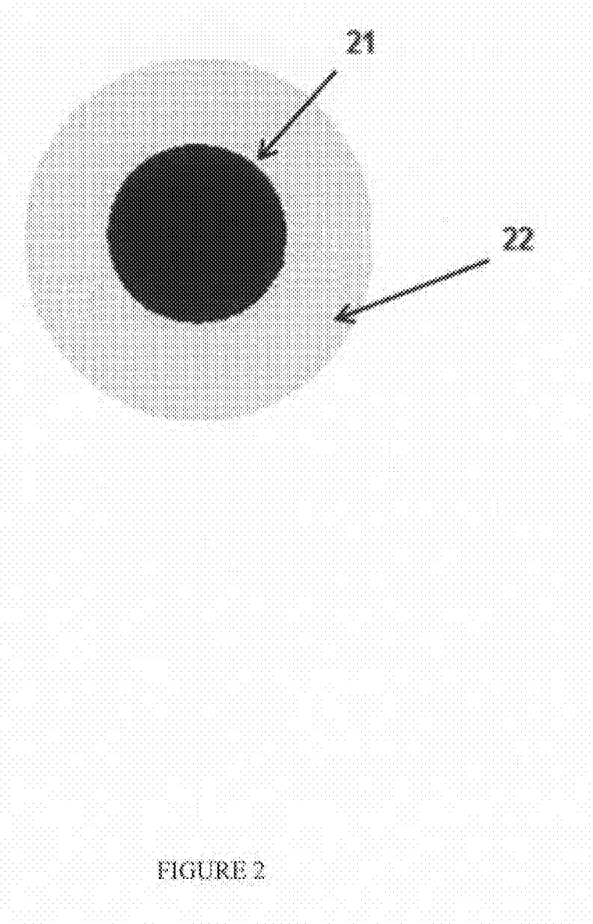
FIG. 2 illustrates a schematic diagram of a single particle of polishing media supported by a carrier.
Figure 3:
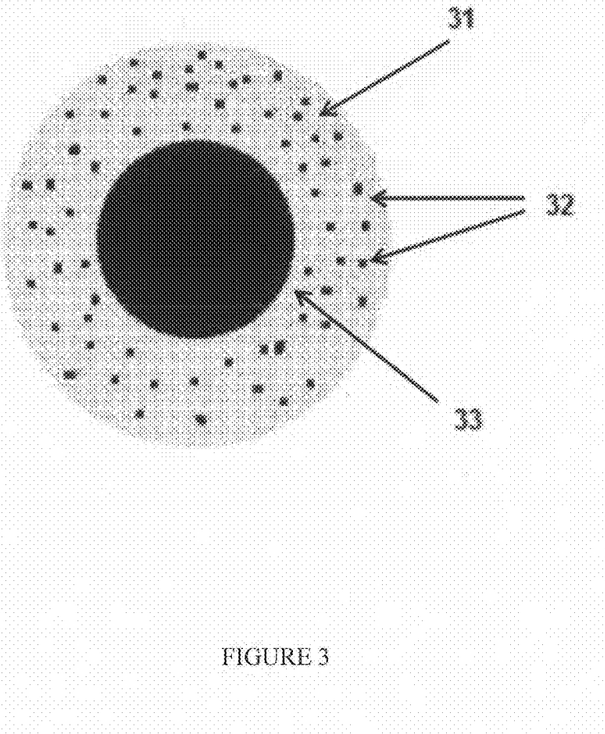
FIG. 3 illustrates a schematic diagram of a plurality of particles of polishing media and a supporting particle supported by a carrier.
Figure 4:
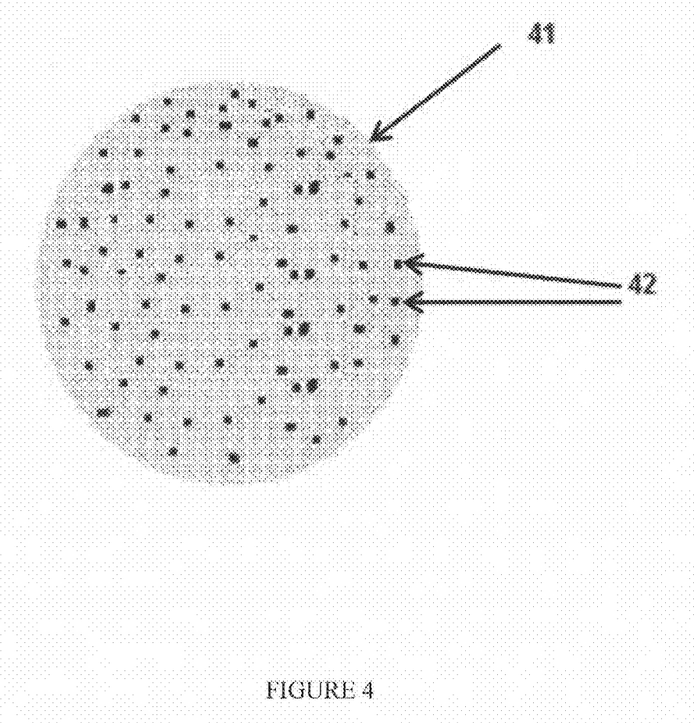
FIG. 4 illustrates a schematic diagram of a plurality of particles of polishing media supported by a carrier.

A preferred carrier and media is shown in FIG. 2 and embodies a single polishing media particle 21 within a carrier 22, where the carrier 22 contains the polishing media particle 21 and provides a means for protecting the surface of what is being polished. FIG. 3 depicts a wool outer shell 31 containing a plurality of polishing media 32 as well as a larger pellet 33. The pellet may be a relatively more dense material such as stainless steel which increases the mass of the carrier/polishing media unit and decreases the polishing time. FIG. 4 depicts a wool carrier 41 with a plurality of polishing media 42 distributed throughout the carrier 41.

In one embodiment, in immersing the polishing media, the polishing media is in a carrier fluid to form a slurry. A slurry is a mixture of the polishing media and a carrier fluid such as water, hydrogen free fluorocarbons, or more viscous organic fluids like glycols. In nonlimiting examples, the slurry may be formed by placing the polishing media into the SRF cavity, then placing the carrier fluid in the SRF cavity. In one alternative, the carrier fluid may be introduced to the SRF cavity first. In another alternative, the slurry may be formed outside the SRF cavity, then the entire slurry is poured into the SRF cavity.

In effect, the carrier fluid acts to fluidize the polishing media. The slurry contemplates a mixture of the carrier fluid and polishing media when the polishing media are also supported by carriers. Additionally, additives such as surfactants may be added to the slurry to enhance fluidizing the media. Representative commercially available surfactants include cocamide DEA, and sodium xylenesulphonate. TS Compound M, available from Mass Finishing, Inc. of Howard Lake, Minn. another such commercially available surfactant. In addition to components added to form the slurry for the polishing operation, the slurry will necessarily hold for at least a period of time any material from the inner surface of the SRF cavity removed during the XMP process.

When using a slurry, generally, temperatures ranging from 10° C. to 70° C., and preferably from 20° C. to 50° C. produce suitable results. With the replacement of water with fluorocarbon refrigerant, operating temperatures can reach below 0° C., to for example −40° C.

Use of a slurry allows for modifying the pH (H+concentration) of the slurry to favor micro-machining with particles below 15 microns also minimizes smearing. It is thought that adding adjusting the pH of the slurry could make the niobium harder or softer and effect the polishing. Where a low pH introduces hydrogen, the niobium becomes harder. Niobium is very soft such that hydrogen loading hardens the metal, speeding up the polishing and improving the surface finish.

In loading the media into the SRF cavity, the SRF cavity is filled approximately 30-70 percent by volume with the polishing media, polishing media in carriers, or slurry. Preferably, the cavity is filled about 50 percent by volume with the polishing media, polishing media in carriers, or slurry. After loading the contents, the SFR cavity is capped prior to rotating the SRF cavity such that contents are confined to the inner cavity. Preferably, the SRF should be capped with a cap made of a like material. For instance, typically a niobium SRF should in turn be capped with a niobium cap. Using a cap of the same material minimizes contamination of the cavity constitution with a foreign material.

In rotating the SRF cavities, the superconducting cavities are rotated along their longitudinal axis such that the polishing media, and any respective carrier and slurry, is forced against the inner surface of the superconducting cavity. When rotating is accomplished by a centrifugal barrel polishing machine, the CBP machine can operate at different revolution rates, which impart differing amounts of force on the polishing media against the inner surface.

The rotation on the SRF cavity imparts sufficient force on the polishing media against the inner surface of the SRF cavity while keeping the polishing media fluidized and in near constant contact with the cavity's inner surface. A speed too low does not impart enough force on the inner surface of the cavity to machine the inner surface. Additionally, too little force unnecessarily extends the duration of the process. Too much force imparted by the polishing media onto the inner surface due to too high a speed causes the polishing media to become pinned to the inner surface, preventing machining all together or causing gouging or other surface defects.

In terms of force imparted by the polishing media against the inner surface of the SRF during rotation, the optimal force to apply the polishing media is from about 5 G to about 30 G. G force is defined is a measurement of the type of acceleration that indirectly causes weight. A more preferred range of G force is 6 to 7 G for optimal surface finish. A preferred range for a high material removal rate is from 23 to 25 G. When using a CBP machine, the force is measured by a moment arm rising approximately 18 inches on the CBP used in the examples below. The shape of the media may also affect how the media contacts the surface and how much force is applied to the surface. While complex geometries of some cavities may result in gaps where the media is contacting the surface, this will not affect the final finish as the polishing media are constantly fluidized; therefore the gaps are constantly displaced.

Figure 5:
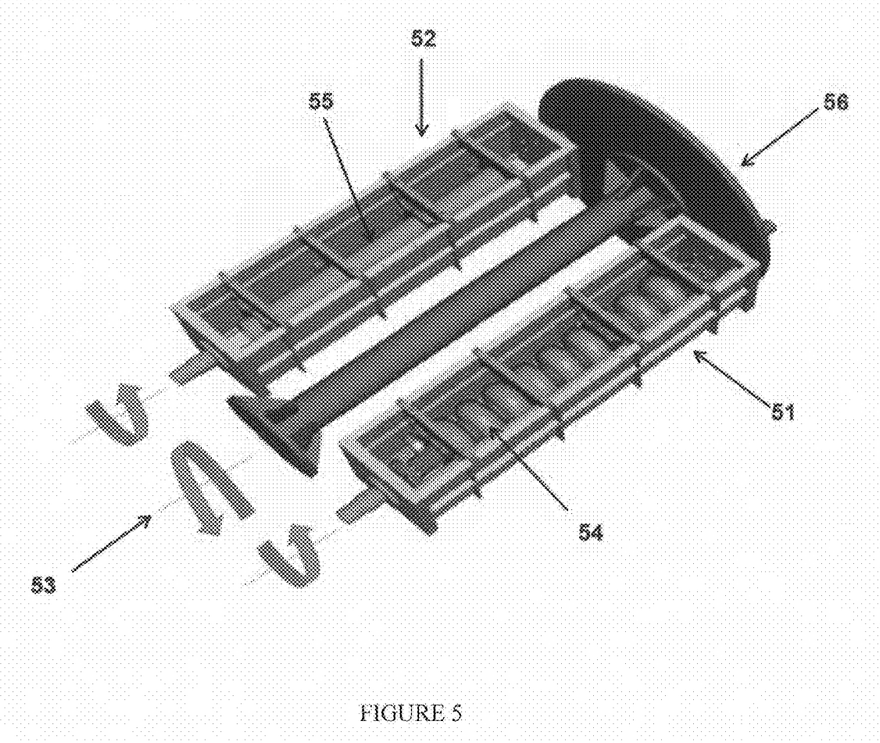
FIG. 5 illustrates mounting a SRF cavity to a CBP machine.

A centrifugal barrel polish (CBP) machine provides a means for imparting pressure to polishing media against cavity surfaces. FIG. 5 depicts mounting a SRF cavity to a CBP, providing a means to rotate a SRF along the SRF's longitudinal axis. FIG. 5 shows two buckets, 51 and 52, of the centrifugal barrel polishing machine, with the longitudinal main axis 53 of the machine positioned between the buckets. An exemplary nine-cell SRF cavity 54 is secured in a bucket 51. The diametrically opposing bucket 52 contains a counterweight 55. Each bucket rotates around the central shaft 53 of the CBP machine, while at the same time each bucket 51 and 52 counter-rotates around its own axis at the same rate. This motion is shown by the arrows in FIG. 5. Each end of the central shaft 53 is rigidly attached to a hub 56, and each of the buckets is in rotatable communication with the hub 56. Rotation around the central shaft 53 is up to 115 RPM. Each of the buckets 51 and 52 rotates around its own axis one time par revolution around the main shaft 53. To better show the complete assembly both buckets are shown with the open side up. In an actual machine the bucket in the background has the open side facing down. Since polishing is done with the cavity axis horizontal, counter-rotation evenly distributes any effect of gravity. Counter-rotation also increased the viscous shear of the polishing media along the cavity's inner surface, which was found to improve the polishing action.

The SRF's are rotated for a time sufficient to remove the desired amount of material. Removal rate depends on rotation rate, hardness of material, and type of material. Removal rates for rough polishing can be around 5 microns of material removed per hour. Removal rates for final polishing steps are hard to characterize but are less than 1 micron removed per 24 hours.

Upon completion of rotation of the SRF cavity, the SRF cavity is evacuated. In evacuating the SRF cavity, the XMP materials such as polishing media and carrier fluid are substantially removed by pouring, siphoning, vacuuming, or other processes. An inert atmosphere such as argon or dry nitrogen may be introduced or remain in the SRF cavity. A chemical rinse sequence may be performed using a number of solvents, with suitable solvents those which effect bulk rinsing of media remnants from the surface of the cavity. As such, suitable solvents include, but are not limited to sulfuric acid, nitric acid, phosphoric acid, hydrofluoric acid, and combinations thereof.

Generally, the cavities are only rinsed with water between polishing steps. Where high pressure rinsing is utilized generally, pressures between about 500 and 2000 psi are suitable, with pressures between 1000 psi and 1500 psi preferred and 1200 psi most preferred. Multiple passes, three to five for example, of a high pressure rinse may be performed along the length of the inner of the cavity.

Upon completion of the material removal, a high temperature bake sequence is utilized to remove any hydrogen which would otherwise diffuse from the ambient environment and the rinse material into the cavity surface. Temperatures ranging from 600° C. to 1000° C., and preferably 800° C., are suitable. With respect to temperature versus hold time at that temperature in a heat treatment, a higher temperature results in a lower hold time. For example, at 600° C., the hold time may be 12 to 18 hours, but the ramp up and ramp down times to that temperature would extend the overall heat treatment up to 48 hours. At 900° C., the hold time can be as short as 1 to 2 hours yet the heat treatment with ramp up and ramp down may still last up to 48 hours.

A surfeit of hydrogen, which otherwise forms as a precipitate at 100 K as the cavity is cooled to its 2 K operating temperature, is to be avoided as this precipitate and its remnants are problematic for optimal cavity operation. Preferably, high temperature baking is done under vacuum (between approximately $10^{-5}$ and $10^{-7}$ torr at operational temperatures). Low temperature baking occurs between approximately 100° C. and 150° C., with 120° C. being preferred, also under vacuum but with no active pumping. The low temperature bake is done generally above the point where unbound hydrogen and surface hydroxyl groups detach from the polished surface. In an embodiment of the invention, temperatures are selected to be above boiling point the carrier fluid fluidizing the media. For water, a temperature of above 100° C. is suitable, preferably between 100° C. and 150° C. and most preferably at 120° C.

Another embodiment of the invention is the introduction of hydrogen which is assiduously avoided. It is noteworthy that the protocol enables all required cavity surface preparation to be performed in one step. Specifically, the standard chemistry/heat treatment/chemistry process has been replaced by the invented XMP process. This is achieved by removing hydrogen from the XMP polishing media/slurry, including degassing of the media, reducing hydrogen diffusion rate by decreasing temperature and by putting an inert, hydrogen free, atmosphere on or in the cavity to minimize hydrogen near the surface of the cavity. Exemplary inert atmospheres include filling the cavity with an atmosphere of argon or helium, or putting the cavity under vacuum conditions. As the elimination of exposure of the cavity to hydrogen by using an inert environment, the hydrogen bake out (heat treatment) step is eliminated. Another method to limit exposure of the inner cavity to contamination is to cap the SRF cavities during the heat treatment processes and when they outside and inert atmosphere such that contaminates cannot enter the SRF cavity.

EXAMPLE 1

The XMP process used one bulk material removal stage and four polishing stages, all conducted at ambient temperature. (Other temperatures are also appropriate, depending on manufacturing conditions. Generally, temperatures ranging from 10° C. to 70° C., and preferably from 20° C. to 50° C. produced suitable results. With the replacement of water with fluorocarbon refrigerant, operating temperatures can reach below 0° C., to for example −40° C.

The subset of five stage, described below, and as depicted in FIG. 5, was conducted for niobium cavities. In the first stage, 9 mm×9 mm of the KM ceramic angle out triangle media was spun inside the cavity to remove approximately 80 m of material at a removal rate of 10 m/hr. This stage provides a means for scraping away the equatorial weld bead.

The second stage ran for approximately 12 hours at a material removal rate of 3 µm/hr.; using the 12.5 mm RG-22 cones. Both the first and second steps used enough de-ionized (DI) water as the carrier fluid to just cover the media and a surfactant called TS Compound provided by Mass Finishing, Inc. (approximately 1 TS Compound: 40 parts water).

The final 3 stages used 4 mm cubic hardwood blocks to hold various polishing media. The third stage used 400 mesh alumina powder and water to form a slurry, the fourth stage 800 mesh alumina powder and water to form a slurry (both from Kramer Industries, Inc.), and the final stage used the 40 nm colloidal silica. The alumina was mixed at 50-100 g alumina per liter of fluid. The wood blocks were soaked in the alumina-water and colloidal silica for 12 hours before use. Processing times were approximately 15 hours for stage 3, 20 hours for stage 4, and 72 hours for stage 5.

Optionally, the third stage using 400 mesh alumina powder can be eliminated. With this elimination, two embodiments of the invented process are primarily a three stage process if a mirror finish using the colloidal silica is not required, or a four stage process which yields mirror finishes. A light electropolishing stage was done after the XMP process. The cavity was also given high-vacuum heat treatment at 800° C. and a high-pressure rinse with ultrapure water. Assembly was completed with couplers and fittings in a class 10 clean room.

Figure 6:
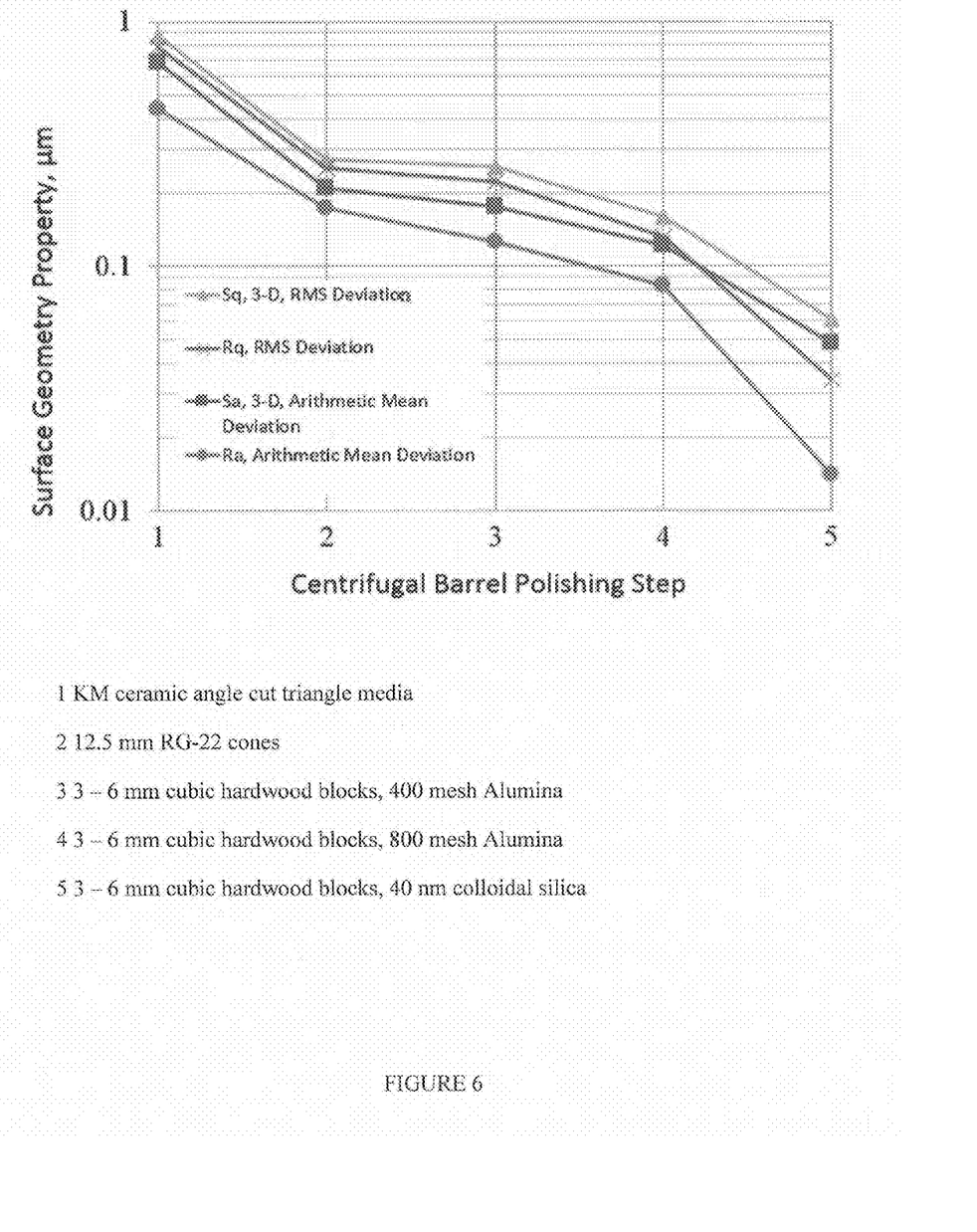
FIG. 6 is a graph showing the effects of polishing using five different media.

The final finish after the XMP and electropolishing processes is substantially the finish that electropolishing alone yields, e.g., 0.1 micron Ra. FIGS. 5 and 6 show the effect of each of the 5 different media during the XMP process. FIG. 5 plots the RMS deviation (RQ, SO) and arithmetic mean deviation (RA, SA) for the sample after each XMP step. FIG. 6 is a graph of the maximum peak height and valley depth obtained from the surface profilometer after centrifugal barrel polishing with each one of 5 different media. Sample size is 1 mm with scans taken 1 µm apart and data points take every micron.

SO and SA are values for the entire 1 mm×1 mm surface scan (30 values), while RQ and RA are values for 1 mm long lines extending across the scan area (2D values). The RQ and RA values are the average of 1000 lines spaced 1 µm apart. No error bars are shown because they lie within the data markers on the graph.

The parameters show the same general trend, with large decreases in values produced by the sequence from step 2, the first polishing step, to step 5, polishing with colloidal silica. The RA is decreased finally to 14 nm and the SA in 48 nm. These values are significantly less than the 0.1 11 m RA values typically obtained by EP.

Excellent performance was obtained after light electropolishing was subsequently applied to remove only the final 20 µm of metal. Application of the invented XMP method to the nine-cell cavity was successful. Further, utilization of only the final light electropolishing substantially eliminated the hydrogen uptake by the cavity that is otherwise seen in bulk electropolishing paradigms. Thus, the invented process reduced the amount of material that must be removed after CBP processing and enables the use of a chemical rinse instead of greater electropolishing.

Excellent superconducting properties resulted after initial process optimization, with a quality (Q) factor of $3 \times 10^{10}$ and accelerating gradient of 43 MV $m^{-1}$ being attained for a single-cell TESLA cavity, which are both close to practical limits. Some of these cavities exhibited equator weld defects that caused quench at <20 MV m−1 and were not improved by further electropolishing. The high gradients obtained after applying the extended mechanical polishing recipe demonstrates that defects can be repaired.

In summary, the XMP process provided a smooth inner surface which allows for higher SRF performance, while using only a relatively small amount of acid in a final light electropolishing finishing stage.

EXAMPLE 2

Figure 7:
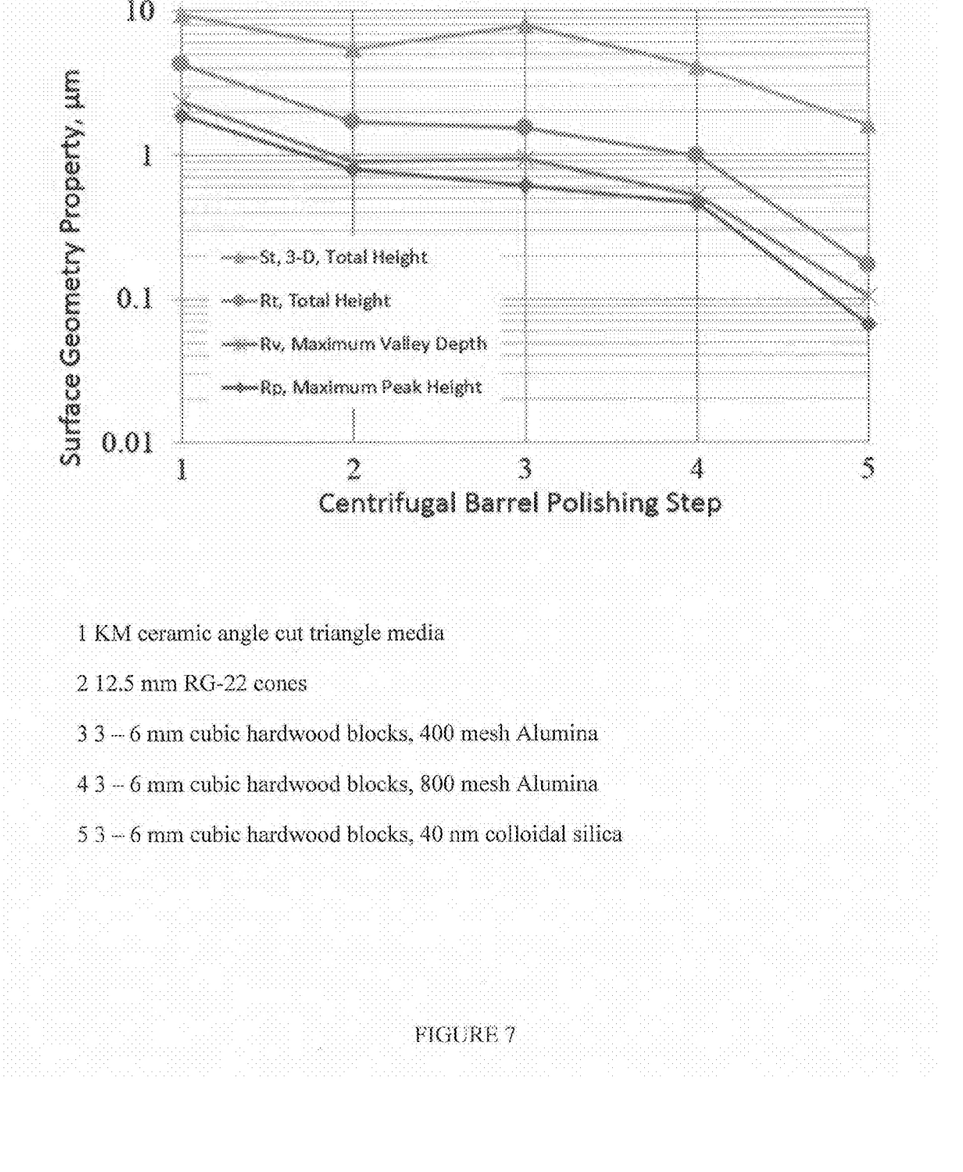
FIG. 7 is a graph showing the effects of polishing using five different media.

The XMP process used one bulk material removal stage and three polishing stages, all conducted at ambient temperature. The example was performed on three niobium SRF cavities and an additional cavity used as a control during evaluation. The subset of four stages, described below, and as depicted in FIG. 7, was conducted for the SRF cavities. In the first stage, 9 mm×9 mm KM ceramic angle cut triangle media was spun inside the cavity to remove approximately 80 μm of material at a removal rate of 10 μm/hr. This step provides a means for scraping away the equatorial weld bead.

The second stage ran for approximately 12 hours at a material removal rate of 3 μm/hr.; using the 12.5 mm RG-22 cones. Both the first and second steps used enough DI water as the carrier fluid to just cover the media and a surfactant called TS Compound provided by Mass Finishing, Inc. (approximately 1 TS Compound: 40 parts water).

The third stage used 4 mm cubic hardwood blocks as carriers and 600 mesh alumina powder. The alumina was mixed at 50-100 grams per liter of water carrier fluid. The wood blocks were soaked in the alumina-water and colloidal silica for 12 hours before use. The third stage was performed for approximately 30 hours.

A final, fourth, stage was performed using the 40 nm colloidal silica. As in the third stage, the fourth used 40 mm cubic hardwood blocks as carriers, soaked in a mixture of 50-100 grams per liter of water for 12 hours. The fourth stage was performed for approximately 72 hours and polished the inner surface of the SRF to a mirror finish.

Figure 8:
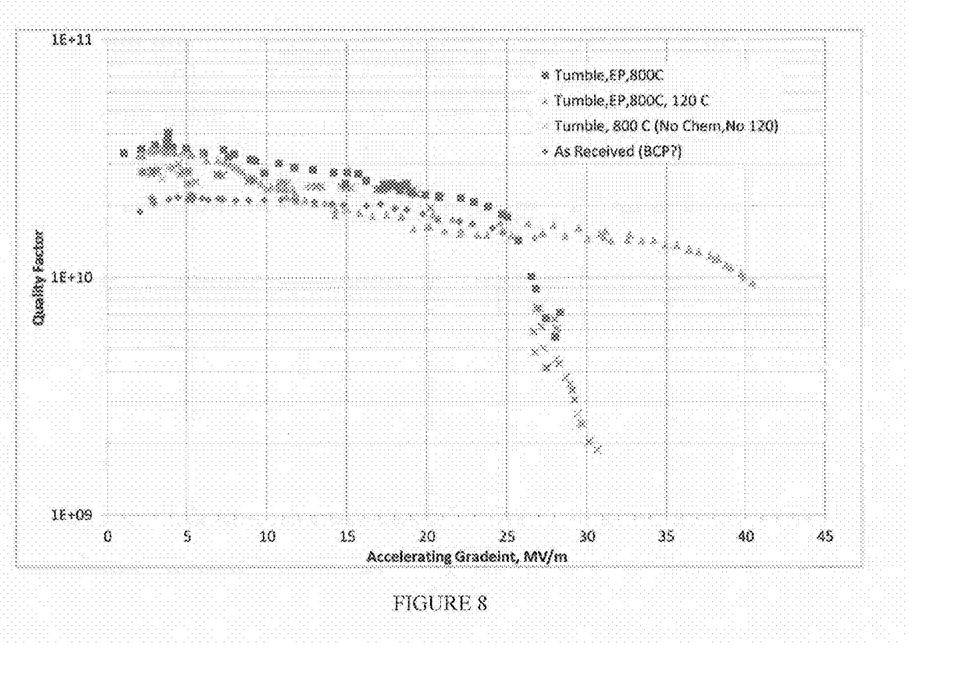
FIG. 8 is a graph showing the performance of three SRF cavities after undergoing the invented method.

As seen in FIG. 8, the first cavity which underwent the XMP method was given a light electropolishing treatment followed by a heat treatment at 800° C. The second cavity was given a light electropolishing treatment followed by a heat treatment at 800° C. and a second heat treatment at 120° C. The third cavity only underwent a only the 800° C. heat treatment. Assembly was completed with couplers and fittings in a class 10 clean room.

FIG. 8 demonstrates that the XMP with the 800° C. heat treatment alone provided a SRF with performance equal to that of the SRF cavity that received the light electropolishing. This demonstrates the final polishing stage did not contaminate the inner surface of the SRF cavity with hydrogen and that entirely chemistry free surface preprocessing is possible. Further, the testing demonstrated that the enhanced performance of the SRF cavity which received the 120° C. heat treatment reveals higher performance is available, and further suggests that when the XMP method is done in an environment free of contaminates such as hydrogen, the higher performance is still achievable since contaminate loading of the inner surface is prevented. As noted supra, this can be achieved by capping performing the XMP process using only degassed components and in and inert atmosphere.

The final finish after the XMP and electropolishing processes is substantially the finish that electropolishing alone yields, e.g., 0.1 micron Ra. FIGS. 7 and 8 show the effect of each of the 5 different media during the XMP process. FIG. 5 plots the RMS deviation (RQ, SO) and arithmetic mean deviation (RA, SA) for the sample after each XMP step. FIG. 6 is a graph of the maximum peak height and valley depth obtained from the surface profilometer after centrifugal barrel polishing with each one of 5 different media. Sample size is 1 mm with scans taken 1 μm apart and data points take every micron.

SO and SA are values for the entire 1 mm×1 mm surface scan (30 values), while RQ and RA are values for 1 mm long lines extending across the scan area (2D values). The RQ and RA values are the average of 1000 lines spaced 1 μm apart. No error bars are shown because they lie within the data markers on the graph.

The parameters show the same general trend, with large decreases in values produced by the sequence from step 2, the first polishing step, to step 5, polishing with colloidal silica. The RA is decreased finally to 14 nm and the SA to 48 nm. These values are significantly less than the 0.1 11 m RA values typically obtained by EP.

The invention disclosed is particularly useful for the manufacture of smooth inner surfaces in SRF cavities. In certain embodiments, a polishing media is loaded into a superconducting cavity, then the cavity is rotated along its longitudinal axis such that the polishing media machines the inner surface of the superconducting cavity to produce the smooth surface.

All publications and patent documents cited in this application are incorporated by reference in their entirety for all purposes to the same extent as if each individual publication or patent document were so individually denoted.

I claim:

1. A method for preparing superconducting cavities comprising:
   selecting a polishing media, where the polishing media have a representative diameter from about 0.001 microns to about 40 microns, and where the polishing media is bound to a carrier;
   loading the polishing media from about ⅓ to about ⅔ capacity into a superconducting cavity having an inner surface;
   capping the superconducting cavity with a cap comprised of the same material as the superconducting cavity;
   mounting the superconducting cavity to a centrifugal barrel polishing machine; and,
   rotating the superconducting cavity along its longitudinal axis such that the polishing media machines the inner surface of the superconducting cavity for such time that the inner surface of the resonance cavity is machined to a surface smoothness of less than 15 nm root mean square roughness over approximately a 1 mm² scan area.

2. The method of claim 1 further comprising rotating the superconducting cavity in an inert atmosphere.

3. The method of claim 1 further comprising where the carrier is wool.

4. The method of claim 1 further comprising where the carrier is wood.

5. The method of claim 1 further comprising evacuating the superconducting cavity; and,
   heating in a heat treatment the superconducting cavity to a temperature in a range from about 600° C. to about 900° C. for a period of about 1 hour to about 48 hours.

6. The method of claim 1 further comprising evacuating the superconducting cavity; and,
   heating in a heat treatment the superconducting cavity to a temperature in a range from about 80° C. to about 200° C. for a period of about 1 hour to about 48 hours.

7. The method of claim 1 further comprising rotating the superconducting cavity at a velocity to impart a force from about 5 G to about 30 G on the polishing media against the inner surface.

8. The method of claim 1 further comprising where the polishing media is colloidal silica, and where the carrier is a hardwood block;
   evacuating the superconducting cavity and,
   heating in a heat treatment the superconducting cavity to a temperature in a range from about 600° C. to about 900° C. for a period of about 1 hour to about 48 hours.

9. A method for preparing superconducting cavities comprising:
   selecting a polishing media;
   immersing the polishing media in carrier fluid to form a slurry;
   loading the slurry from about ⅓ to about ⅔ capacity into a superconducting cavity having an inner surface;

capping the superconducting cavity with a cap comprised of the same material as the superconducting cavity;

mounting the superconducting cavity to a centrifugal barrel polishing machine; and, rotating the superconducting cavity along its longitudinal axis such that the polishing media machines the inner surface of the superconducting cavity for such time that the inner surface of the resonance cavity is machined to a surface smoothness of less than 15 nm root mean square roughness over approximately a 1 mm$^2$ scan area.

10. The method of claim 9 further comprising where the polishing media is selected from the group of ceramic, ceramic composite, plastic, wood, wool, natural and synthetic fibers and metal.

* * * * *